(12) United States Patent
Gupta et al.

(10) Patent No.: US 7,246,252 B1
(45) Date of Patent: Jul. 17, 2007

(54) DELAY COMPENSATION

(75) Inventors: Chandrasekaran N. Gupta, San Jose, CA (US); Dean C. Moss, Raleigh, NC (US)

(73) Assignee: Xilinx, Inc., San Jose, CA (US)

( * ) Notice: Subject to any disclaimer, the term of this patent is extended or adjusted under 35 U.S.C. 154(b) by 485 days.

(21) Appl. No.: 10/749,302

(22) Filed: Dec. 31, 2003

(51) Int. Cl.
*G06F 1/00* (2006.01)

(52) U.S. Cl. ................................................. 713/500

(58) Field of Classification Search ................. 713/500
See application file for complete search history.

(56) References Cited

U.S. PATENT DOCUMENTS

| 6,192,004 | B1 * | 2/2001 | Aikawa et al. | 365/233 |
| 6,289,406 | B1 * | 9/2001 | Chambers et al. | 710/107 |
| 6,697,926 | B2 * | 2/2004 | Johnson et al. | 711/167 |
| 6,941,433 | B1 * | 9/2005 | Libby et al. | 711/167 |

* cited by examiner

*Primary Examiner*—Rehana Perveen
*Assistant Examiner*—Eric Chang
(74) *Attorney, Agent, or Firm*—W. Eric Webostad

(57) ABSTRACT

Delay compensation is described. A clock signal used to generate a transmit clock is obtained. Clock cycles are counted to provide a count signal associated with external device latency. The count signal is captured responsive to the clock signal.

12 Claims, 2 Drawing Sheets

US 7,246,252 B1

DELAY COMPENSATION

FIELD OF THE INVENTION

One or more aspects of the invention relate generally to delay compensation and more particularly, to providing a data valid signal.

BACKGROUND OF THE INVENTION

Conventionally, for an integrated circuit, such as a memory, that did not provide a data valid signal, a worst case timing is used to determine frequency of operation between the integrated circuit and another integrated circuit. However, heretofore, this worst case timing analysis was difficult to arrive at due to a complex interaction, for example variation in timing parameters, such as deterministic jitter, random jitter, and duty cycle distortion, or minimum versus maximum timings for input/output drivers.

Heretofore, in practice, a user would have to do a rough approximation of a worst case timing analysis, and then hone such an approximation by testing an actual interface between two integrated circuits. This could prove costly, both in terms of engineering time and laboratory resources, as well as design impact, as a substantially inaccurate approximation may result in over consumption of clock resources or a redesign.

Accordingly, it would be desirable and useful to provide a worst case timing analysis that avoids one or more of the above-mentioned limitations.

SUMMARY OF THE INVENTION

An aspect of the invention is a method for delay compensation, comprising: obtaining a clock signal used to generate a transmit clock; counting clock cycles to provide a count signal associated with external device latency; and capturing the count signal responsive to the clock signal.

Another aspect of the invention is a delay compensation system, comprising: a first integrated circuit, the first integrated circuit including output drivers, one of the output drivers configured to provide a transmit clock signal and another of the output drivers configured to provide a read command signal; and a second integrated circuit coupled to the first integrated circuit to receive the transmit clock signal and the read command signal, the second integrated circuit configured to provide a read clock signal responsive to the transmit clock signal and to provide a data signal responsive to the read command signal. The first integrated circuit includes a delay compensation circuit configured to operate synchronously with the transmit clock signal for a send portion and to operate synchronously with the read clock signal on a receive portion.

Another aspect of the invention is a circuit for providing a data valid signal, comprising: a counter for counting down latency associated with another integrated circuit; a first register coupled to receive output of the counter at a first data input, the first register clocked synchronously with a transmit clock signal for the other integrated circuit to provide output of the counter at a first data output; and a second register having a second data input coupled to the first data output of the first register to receive output of the counter, the second register clock synchronously with a read clock signal, the second register providing the valid data signal at a second data output.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
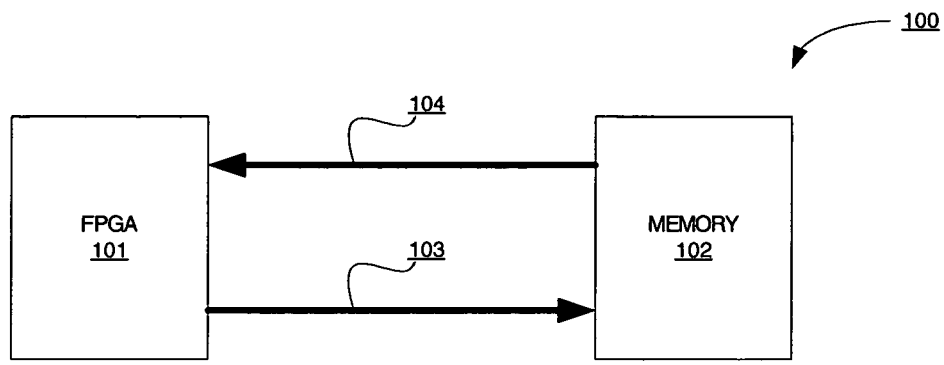
FIG. 1 is a block diagram depicting an exemplary embodiment of an FPGA-memory system.

FIG. 1 is a block diagram depicting an exemplary embodiment of an FPGA-memory system 100. System 100 includes two integrated circuits. One of the integrated circuits sends a request for data to the other of the integrated circuits. For example, one of the integrated circuits is a field programmable gate array ("FPGA") 101, and FPGA 101 requests data from the other integrated circuit which is memory 102. Conventionally, memory 102 is a QDR or DDR SRAM, though other types of memory may be used, including static, dynamic or non-volatile, as well as random access or read-only. Conventional, QDR or DDR SRAM do not provide a data valid signal. Notably, other integrated circuits may be used where the integrated circuit providing the data does not provide a data valid signal. Furthermore, it will become apparent that a single, double, quad or other data rate may be used.

FPGA 101 sends a read command and an address 103 to memory 102, which in response reads data at the specified address and sends the read data 104 to FPGA 101. Delay between sending a request for data and receiving the data will be a function of the delays associated therewith. However, these delays may differ from one FPGA to the next and from one memory to the next. Differences in delays may be due to one or more of process variation, voltage regulation variation, and variation in temperature dependence. The impact of such a delay goes up with frequency of operation. Notably, for state machine operation, there is some time for which valid data is expected in order to be registered.

Figure 2:
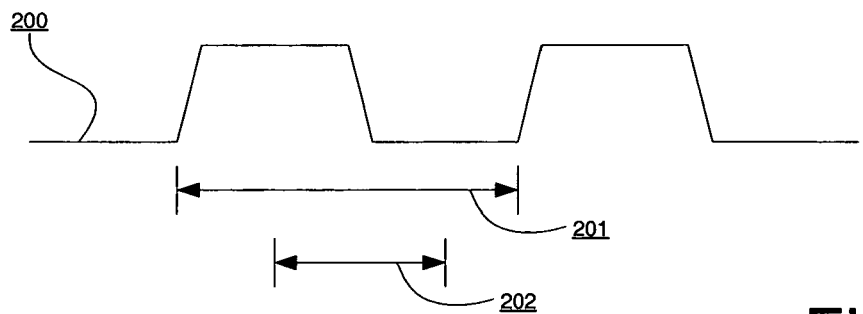
FIG. 2 is a signal diagram depicting an exemplary embodiment of a clock signal.

For example, in FIG. 2, there is shown a signal diagram depicting an exemplary embodiment of a clock signal 200. Clock signal 200 has a period of 201. If latency between sending a request for data and receiving the data is time delay 202, then the relationship of period 201 to time delay 202 provides an indication of latency impact. Notably, delay 202 will not be substantially changed as frequency of clock signal 200 is changed. Thus, if time delay 202 is sufficiently large with respect to period 201, period 201 may have to be increased. A state machine used to capture valid data is dependent upon clock latency being a fixed number of clock cycles. If latency is too long, the clock period is increased to meet the target fixed number of clock cycles for the state machine though this reduces the frequency of operation. Accordingly, a worst case latency is taken into account when designing an interface between FPGA 101 and memory 102 to determine a maximum frequency of operation.

Figure 3:
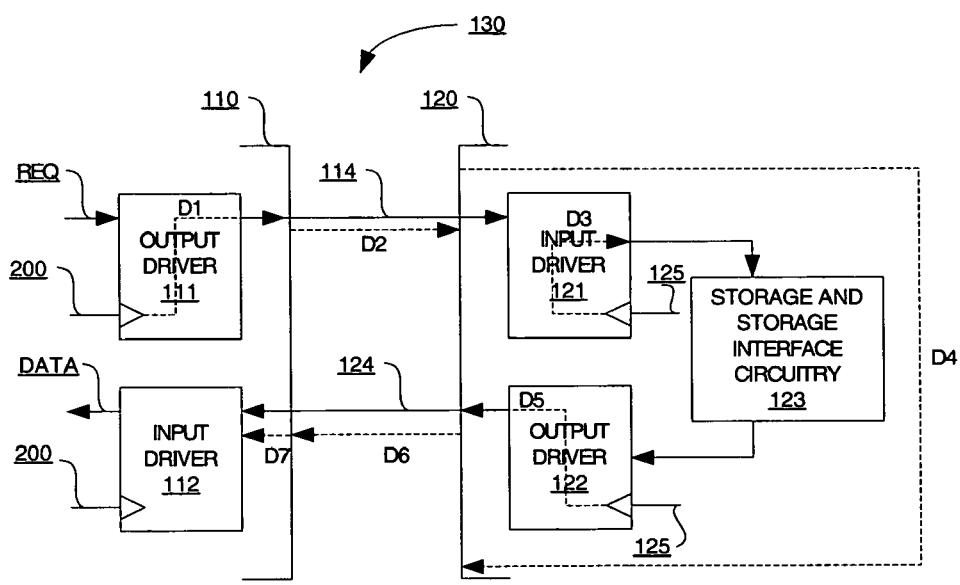
FIG. 3 is a block diagram depicting an exemplary embodiment of a circuit-to-circuit system.

FIG. 3 is a block diagram depicting an exemplary embodiment of a circuit-to-circuit system 130. System 130 includes an integrated circuit 110 which requests data from integrated circuit 120. Integrated circuit 110 includes an output driver 111 and an input driver 112. Each of drivers 111 and 112 are driven by internal clock signal 200.

Notably, an integrated circuit, such as integrated circuit 110, may have many different input ports, output ports, or input/output ports, and thus many different drivers. These drivers conventionally vary with respect to clock-to-out delays. Furthermore, an integrated circuit may have gone through a process shrink or other process change which changes clock-to-out delays of drivers. It should be appreciated that as described below, an integrated circuit may change clock-to-out delay without having to redesign the interface. This is because an internal data valid signal is sent to compensate for delay, as described below in additional detail.

A read request is clocked into output driver 111 of integrated circuit 110, which represents a starting point. There will be some clock-to-out delay of the read request through output driver 111, which delay shall be referred to as D1. The read request is sent over interconnect 114. There will be some propagation delay of the read request over interconnect 114, which delay shall be referred to as D2. There may be a setup time delay of drivers 121 and 122, which may be added into the total delay or be included as part of delay D4. The read request is clocked into input driver 121 of integrated circuit 120. There will be some clock-to-out delay of the read request through input driver 121, and this delay through input driver 121 shall be referred to as D3.

Additionally, there will be a delay to process the read request through storage and storage interface circuitry 123, which delay shall be referred to as D4. Latency, D4, is conventionally specified for an integrated circuit, such as a memory, to include delays in input and output drivers. However, because of variation of drivers, as well as phase relationship of clock signals, there are delays with respect to input and output drivers of integrated circuit 120 beyond that specified for D4. Notable, D4 or read latency is conventionally specified as a number of clock cycles for a particular frequency of operation.

Once data is obtained in response to a read request, the data is sent from integrated circuit 120 via interconnect 124 to integrated circuit 110. The data is provided from output driver 122. There will be some clock-to-out delay of the data through output driver 122, which delay shall be referred to as D5. The data sent over interconnect 124 will have a propagation delay, which delay is referred to as D6. The data is input to input driver 112 for which there will be a setup delay, which delay is referred to as D7.

Accordingly, total delay from time of request to output of received data is:

$$\text{Total Delay} = D1 + D2 + D3 + D4 + D5 + D6 + D7. \quad (1)$$

However, due to differences in drivers, as well as possible differences in phase relationship of clock signals, delays D3 and D5, as well as setup delays for drivers 121 and 122, are conventionally unknown. However, D4 is specified, and thus, if D1, D2, D6 and D7 are subtracted out from Total Delay, delay compensation may be achieved.

Figure 4:
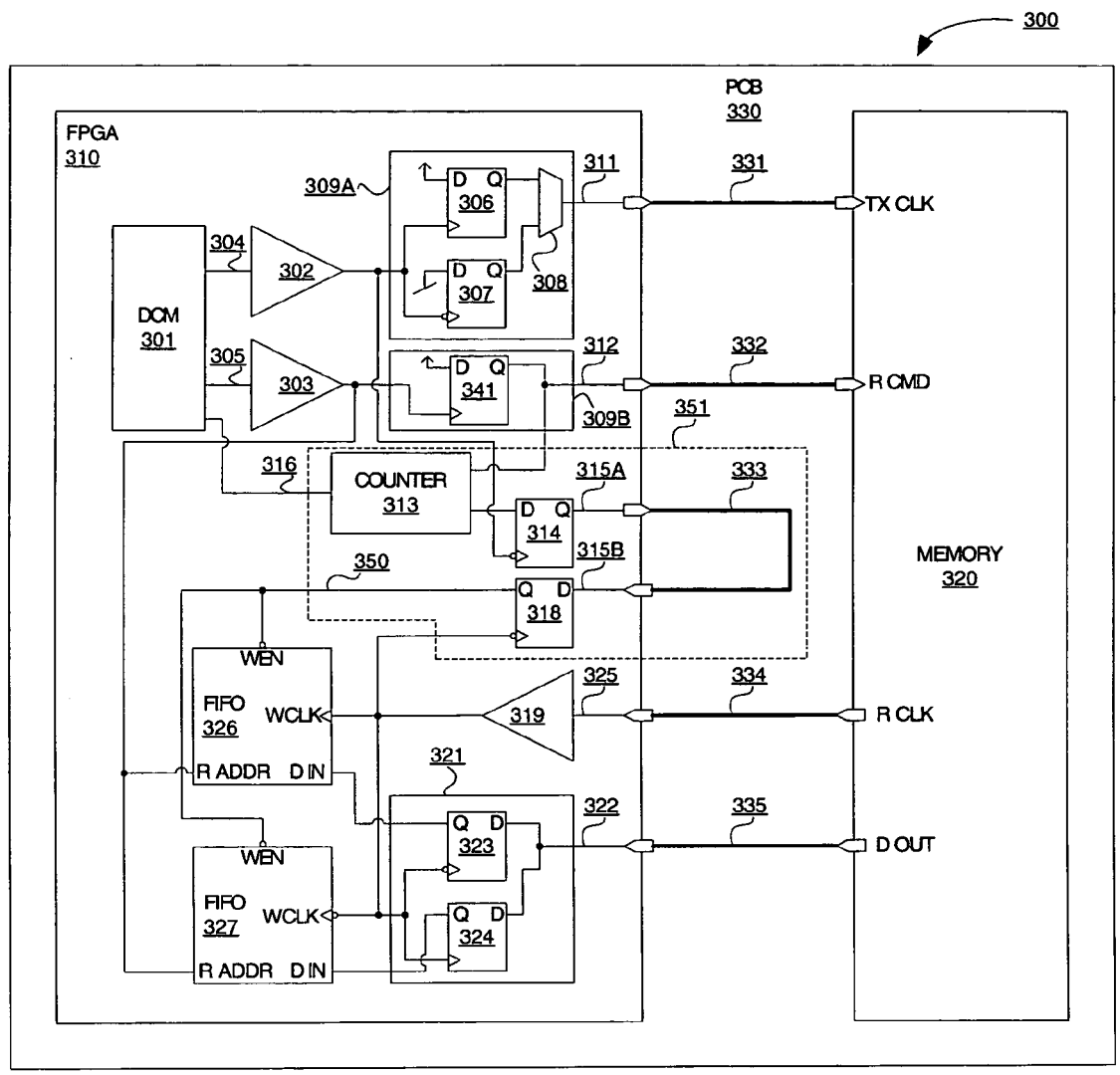
FIG. 4 is a block/schematic diagram depicting an exemplary embodiment of a delay compensation system.

FIG. 4 is a block/schematic diagram depicting an exemplary embodiment of a delay compensation system 300. Delay compensation system 300 is described in terms of an FPGA 310 coupled to a QDR SRAM 320 via a printed circuit board ("PCB") 330. Again, though an FPGA coupled to a QDR SRAM is described, it will be apparent that other types of integrated circuits may be used.

Digital clock module ("DCM") of FPGA 310 provides clock signals 304 and 305. Clock signal 304 is phase-shifted approximately 90 degrees with respect to clock signal 305. Clock signals 304 and 305 may be distributed using buffers 302 and 303, respectively.

Clock signal 304 is provided as a clock input to output driver 309A. Output driver 309A may include flip-flops 306 and 307, which may be DDR flip-flops, where data input to DDR flip-flop 306 is tied to a logic-level high voltage and data input to delay flip-flop 307 is tied to a logic-level low voltage. Clock signal 304 is provided to clock inputs of DDR flip-flops 306 and 307, and outputs of DDR flip-flops 306 and 307 are provided as inputs to multiplexer 308. Notably, because of this high-low configuration, DDR flip-flops are triggered on opposite edges of clock signal 304, as a clock input of either delay flip-flop 306 or 307 is complemented. In the exemplary embodiment shown, clock input to DDR flip-flop 307 is complemented. Output of multiplexer 308 is transmit clock signal 311. Transmit clock signal 311 is coupled to a transmit clock pin of memory 320 via trace 331 of PCB 330. Trace 331 has a route delay.

Clock signal 305 is provided to a separate output driver 309B. Output driver 309B may be configured just like output driver 309A, except that clock signal 305 is used to clock delay flip-flops instead of clock signal 304. Alternatively, output driver 309B may be a flip-flop 341, such as configured like flip-flop 306 (or 307), to provide a Single Data Rate ("SDR") output 332. Output from output driver 309B is read command signal 312. Read command signal 312 is coupled to a read command pin ("R CMD") of memory 320 via trace 332 of PCB 330. Trace 332 is formed to have a route delay approximately equal to that of trace 331.

Memory 320 is conventionally configured to lock onto transmit clock signal 311 provided via trace 331 to a transmit clock pin ("TX CLK") of memory 320 to provide read clock signal 325 via a read clock pin ("R CLK") of memory 320 connected to trace 334, and memory 320 is conventionally configured to provide data signal 322 in response to read command signal 312, where data signal 322 is provided via a data output pin ("D OUT") of memory 320 connected to trace 335. Conventionally, read clock signal 325 and data signal 322 are approximately edge aligned when sent and received, and thus traces 334 and 335 are formed having approximately the same lengths. Notably, there may be more than one data out pin of memory 320 as is known, and there may be a read clock pin ("R CLK") and a complemented read clock coupled to another output pin of memory 320 as is known.

FPGA 310 includes counter 313. Counter 313 may be provided using programmable logic or dedicated logic. Counter 313 is configured to count down from a latency value specified for memory 320. For example, if latency of memory 320 is two clock cycles of a frequency of transmit clock 311 or read clock signal 325, then counter counts down from 2. Notably, latency may be specified including a fraction of a clock cycle, such as 2.5 clock cycles. For latency of 2.5 clock cycles of transmit clock signal 311, DCM 301 may be configured to provide a clock signal 316 which is approximately twice the frequency of transmit clock signal 311. In which embodiment, counter 313 would count down from five. The example values of latency are not intended to be the only values that may be used, and accordingly counter 313 may be configured for any known latency of memory 320.

Output of counter 313 is provided as data input to delay flip-flop 314. Clock signal 304, the same clock signal used to provide transmit clock signal 311, is used to clock delay flip-flop 314. Output 315A, or read valid with clock signal 315, of delay flip-flop 314 is thus responsive to output of counter 313 as clocked off of clock signal 304. Accordingly, when counter 313 counts down to zero, a change in state is sent to data input of delay flip-flop 314. This change in state indicates that memory 320 latency has been met. After reaching zero, counter resumes from the top of a count. Alternatively, counter 313 may be enabled by read command 312, and thus counter would start back at the top of a count and continue counting down responsive to being activated by read command 312.

Read valid with clock signal 315A is generated responsive to clock signal 304 used to generate transmit clock signal 311. Alternatively, read valid with clock signal 315A may be generated responsive to clock signal 305 used to generate read command signal 312. Read valid with clock signal 315A is valid for the same number of clock cycles as valid data is expected to be received via data signal 322. The number of clock cycles may be determined from a burst length of memory 320, which may be user programmable. Notably, read data valid with clock signal 315A is generated from delay flip-flop 314 which may be formed similarly to delay flip-flop 306 or delay flip-flop 307 of output driver 309A for at least approximately matching delays of all of these flip-flops.

Output 315A is provided to loopback trace 333 of PCB 330. Loopback trace 333 has a route delay approximately equal to a sum route delays, namely, one route delay of a trace 331 or 332 and one route delay of trace 334 or 335. FPGA 310 receives input 315B. Though shown as being external to FPGA 310, loopback trace 333 may be internal or external to FPGA 310. However, an internal loopback trace would mean a priori knowledge of minimum and maximum delays of output drivers, which may not be available during manufacture of FPGA 310. Accordingly, an external loopback trace facilitates adaptability via formation of traces, such as on a circuit board. Alternatively, loopback trace 333 need not approximate a sum of propagation delays, as previously described, but could be an internal routing from data output of delay flip-flop 314 to data input of delay flip-flop 318, and data output of delay flip-flop 318 could be held for a fixed number of clock cycles of read clock signal 325, where the fixed number of clock cycles is used to approximate routing delays associated with either trace 331 or 332 and either trace 334 or 335.

Input 315B is the same signal as output 315A, except it is delayed by propagation delay associated with trace 333. Input 315B is provided to a data input of delay flip-flop 318.

Delay flip-flop 318 may be formed similarly to delay flip-flop 323 or 324 of input driver 321.

Read clock signal 325 is provided to buffer 319 whose output is provided to: a clock input of each of delay flip-flops 318, 323 and 324, and write clock inputs of first in first-out ("FIFO") buffers 326 and 327. Notably, though FIFO buffers are shown, it should be understood any form of registers, such as flip-flops, may be used. Data signal 322 is provided to each data input of delay flip-flops 323 and 324 of input driver 321. Output of delay flip-flop 323 is provided to a data input of FIFO buffer 326, and output of delay flip-flop 324 is provided to a data input of FIFO buffer 327. A high-low data configuration is used. So, clock input to delay flip-flop 323 is complemented, such that delay flip-flops clock on different edges of read clock signal 325, and write clock input to FIFO buffer 327 is complemented, such that FIFO buffers 326, 327 are active on opposite edges of read clock signal 325 with respect to delay flip-flops 323, 324, respectively. Accordingly, clock high data may be stored in FIFO buffer 326, clock low data may be stored in FIFO buffer 327.

Read valid with clock signal 315 is captured with delay flip-flop 318 on either a positive or negative edge of read clock signal 325. Selection of which edge to use may be based on which edge afford more margin. The captured read valid with clock signal, namely, read valid with read clock signal 350 or data valid signal 350 is output from delay flip-flop 318.

Data valid signal 350 output from delay flip-flop 318 is provided to a write enable of FIFO buffers 326 and 327. It should be appreciated that delay due to counter 313 approximates D4, delay due to delay flip-flop 314 approximates D1, such as a delay of an output driver 309, delay due to trace 333 approximates the sum of D2 and D6, and delay due to delay flip-flop 318 approximates D7, such as a delay of an input driver 321. In other words, output of delay flip-flop 318 is a form of a data valid signal, namely, data valid signal 350.

Data valid signal 350 is an approximation or pseudo validity signal. This is a form of delay compensation, namely, to compensate for total delay and approximation of such total delay is subtracted out. Thus, a delay compensation circuit 351 includes counter 313, delay flip-flops 314, 318 and optionally trace 333. Mathematically, this compensation delay may be expressed as, $$\text{Compensation Delay} = d1 + d2 + d4 + d6 + d7, \quad (2)$$

where d1, d2, d4, d6 and d7 are respective approximations of D1, D2, D4, D6 and D7. Only contributions of D3 and D5 are left unaccounted. Notably, clock-to-output delay contributions of D3 and D5 may be small in comparison to Compensation Delay of Equation (2), and thus in one embodiment are ignored. In other words, clock-to-output delays D3 and D5 may be determined as a Delay Remaining as, $$\text{Delay Remaining} = \text{Total Delay} - \text{Compensation Delay}, \quad (3)$$

where Delay Remaining is small in comparison to Total Delay.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. A delay compensation system, comprising:
a first integrated circuit, the first integrated circuit including output drivers, one of the output drivers configured to provide a transmit clock signal and another of the output drivers configured to provide a read command signal; and
a second integrated circuit coupled to the first integrated circuit to receive the transmit clock signal and the read command signal, the second integrated circuit configured to provide a read clock signal responsive to the transmit clock signal and to provide a data signal responsive to the read command signal,
wherein the first integrated circuit includes a delay compensation circuit, the delay compensation circuit being configured to operate synchronously with the transmit clock signal for a send portion and to operate synchronously with the read clock signal on a receive portion and wherein the delay compensation circuit includes a counter configured to count responsive to clock pulses to track latency of the second integrated circuit and wherein the counter is configured to reset a count responsive to a latency parameter of the second integrated circuit, the count being enabled to wait for a period of data validity for the data signal.

2. The system, according to claim 1, wherein the send portion and the receive portion are coupled to one another via a loopback trace.

3. The system, according to claim 2, wherein the first integrated circuit and the second integrated circuit are mounted to a printed circuit board having traces coupling the first integrated circuit to the second integrated circuit, the loopback track configured to approximate propagation delay associated with either the transmit clock signal or the read command signal and with either the read clock signal or the data signal along a portion of the traces.

4. The system, according to claim 3, wherein the counter is configured to count down to zero starting from the latency parameter of the second integrated circuit prior to resetting.

5. The system, according to claim 4, wherein the first integrated circuit is a field programmable gate array.

6. The system, according to claim 4, wherein the second integrated circuit is a memory.

7. The system, according to claim 1, wherein the transmit clock signal is generated using a first clock signal, and wherein the read command signal is generated using a second clock signal.

8. The system, according to claim 7, wherein the first clock signal is used to clock the send portion.

9. The system, according to claim 7, wherein the first clock signal, the second clock signal and the clock pulses are separate signals from a same clock source.

10. The system, according to claim 9, wherein the clock source is a digital clock module.

11. The system, according to claim 7, wherein the first clock signal is a phase-shifted version of the second clock signal.

12. The system, according to claim 1, wherein the first integrated circuit comprises at least one storage device coupled to receive a write enable signal, the write enable signal provided responsive to output of the receive portion.

* * * * *